(12) United States Patent
Wang et al.

(10) Patent No.: US 11,616,113 B2
(45) Date of Patent: Mar. 28, 2023

(54) DISPLAY SUBSTRATE, PREPARATION METHOD THEREFOR, AND DISPLAY DEVICE

(71) Applicant: BOE TECHNOLOGY GROUP CO., LTD., Beijing (CN)

(72) Inventors: Ming Wang, Beijing (CN); Wei Li, Beijing (CN); Ce Zhao, Beijing (CN); Wei Song, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 322 days.

(21) Appl. No.: 16/966,847

(22) PCT Filed: Jan. 3, 2020

(86) PCT No.: PCT/CN2020/070327
§ 371 (c)(1),
(2) Date: Jul. 31, 2020

(87) PCT Pub. No.: WO2020/143552
PCT Pub. Date: Jul. 16, 2020

(65) Prior Publication Data
US 2021/0043714 A1    Feb. 11, 2021

(30) Foreign Application Priority Data

Jan. 10, 2019  (CN) .......................... 201910024263.9

(51) Int. Cl.
*H01L 27/32* (2006.01)
*G02F 1/1362* (2006.01)
*H01L 51/56* (2006.01)

(52) U.S. Cl.
CPC .... *H01L 27/3276* (2013.01); *G02F 1/136286* (2013.01); *H01L 51/56* (2013.01)

(58) Field of Classification Search
CPC .................................................. H01L 27/3276
See application file for complete search history.

(56) References Cited

U.S. PATENT DOCUMENTS

2003/0071287 A1* 4/2003 Thomas ................. H01L 23/60
                                                     257/E23.134
2003/0089991 A1   5/2003 Yamazaki et al.
(Continued)

FOREIGN PATENT DOCUMENTS

CN       1429055 A     7/2003
CN     101051158 A    10/2007
(Continued)

OTHER PUBLICATIONS

Decision of Rejection for related CN App. No 201910024263.9 dated Jan. 12, 2021 English translation provided; 9 pages.
(Continued)

*Primary Examiner* — Douglas M Menz
(74) *Attorney, Agent, or Firm* — Procopio, Cory, Hargreaves & Savitch LLP

(57) ABSTRACT

A method of manufacturing a display substrate includes: providing a base substrate; and forming a base insulating layer, a first conductive layer and an interlayer insulating layer that are sequentially stacked on top of one another at a side of the base substrate. The first conductive layer includes at least one break face, the base insulating layer includes a portion extending outward with respect to each of the at least one break face, and the break face and the corresponding portion extending outward constitute an unevenness portion having a stepped shape. The interlayer insulating layer covers at least the unevenness portion(s). Forming the interlayer insulating layer, includes: forming a first insulating sub-layer and a second insulating sub-layer that are sequentially stacked on top of one another; and (Continued)

forming one of the first insulating sub-layer and the second insulating sub-layer by curing a flowable insulating material.

13 Claims, 8 Drawing Sheets

(56) References Cited

U.S. PATENT DOCUMENTS

| | | | |
|---|---|---|---|
| 2007/0236623 A1 | 10/2007 | Heo et al. | |
| 2008/0001151 A1 | 1/2008 | Jun et al. | |
| 2013/0335312 A1* | 12/2013 | Sasagawa | G02B 26/001 |
| | | | 257/E33.044 |
| 2017/0098792 A1 | 4/2017 | Kim et al. | |
| 2017/0243933 A1* | 8/2017 | Kuriyagawa | H01L 51/5253 |
| 2018/0138259 A1 | 5/2018 | Kim et al. | |
| 2018/0166518 A1* | 6/2018 | Kim | H01L 51/0508 |

FOREIGN PATENT DOCUMENTS

| | | |
|---|---|---|
| CN | 101097868 A | 1/2008 |
| CN | 104465652 A | 3/2015 |
| CN | 106783896 A | 5/2017 |
| CN | 108074961 A | 5/2018 |
| CN | 109742091 A | 5/2019 |
| JP | 2015097281 A | 5/2015 |
| KR | 20120061537 A | 6/2012 |

OTHER PUBLICATIONS

First Office Action for related CN App. No. 201910024263.9 dated May 26, 2020. English translation provided; 15 pages.

Second Office Action for related CN App. No. 201910024263.9 dated Sep. 14, 2020. English translation provided; 11 pages.

* cited by examiner

DISPLAY SUBSTRATE, PREPARATION METHOD THEREFOR, AND DISPLAY DEVICE

CROSS-REFERENCE TO RELATED APPLICATIONS

This application is a national phase entry under 35 USC 371 of international Patent Application No. PCT/CN2020/070327 filed on Jan. 3, 2020, which claims priority to Chinese Patent Application No. 201910024263.9, filed on Jan. 10, 2019, which are incorporated herein by reference in their entirety.

TECHNICAL FIELD

The present disclosure relates o the field of display technologies, and in particularly, to a display substrate and a method of manufacturing a display substrate, and a display device.

BACKGROUND

In the related art, a display substrate (such as an array substrate) is usually provided in a display device. A plurality of conductive layers configured to transmit corresponding electrical signals are formed in the display substrate. An insulating layer is disposed between any two adjacent conductive layers in the plurality of conductive layers to electrically isolate the corresponding two conductive layers. By controlling the electrical signals transmitted by each conductive layer images displayed on the display device may be controlled.

SUMMARY

In one aspect, a method of manufacturing a display substrate is provided. The method of manufacturing the display substrate includes: providing a base substrate; forming a base insulating layer, a first conductive layer and an interlayer insulating layer that are sequentially stacked on top of one another at a side of the base substrate. The first conductive layer includes at least one break face, and the base insulating layer includes a portion extending outward with respect to each of the at least one break face. The break face and the corresponding portion extending outward constitute an unevenness portion having a stepped shape. The display substrate includes at least one unevenness portion, and the interlayer insulating layer covers at least the at least one unevenness portion. The step of forming the interlayer insulating layer includes: forming a first insulating sub-layer and a second insulating sub-layer that are sequentially stacked on top of one another, and forming one of the first insulating sub-layer and the second insulating sub-layer by curing a flowable insulating material.

In some embodiments, the flowable insulating material includes an organic, insulating material. The other one of the first insulating sub-layer and the second insulating sub-layer is made of an inorganic insulating material.

In some embodiments, the, organic insulating material includes at least one of polyethylene terephthalate, polycarbonate, polymethyl methacrylate, polyimide, polyethersulfone resin, photoresist, or organic silicone resin.

In some embodiments, the step of forming one of the first insulating sub-layer and the second insulating sub-layer by curing a flowable insulating material includes: forming an insulating film through a coating process by using the flowable insulating material; and performing a curing treatment on the insulating film to form, one of the first insulating sub-layer and the second insulating sub-layer.

In some embodiments, the curing treatment includes a thermal curing treatment. A temperature of the thermal curing treatment ranges from 200° C. to 250° C., and time of the thermal curing treatment ranges from 10 minutes to 30 minutes.

In some embodiments, the step of forming the interlayer insulating layer further includes: forming a third insulating sub-layer on a surface of the second insulating sub-layer facing away from the base substrate. One of the first insulating sub-layer and the second insulating sub-layer, and/or the third insulating sub-layer is made of the inorganic insulating material.

In some embodiments, the first insulating sub-layer and the third insulating sub-layer are made of a same inorganic insulating material.

In some embodiments, the method of manufacturing the display substrate further includes forming a second conductive layer on a surface of the interlayer insulating layer facing away from the base substrate. An orthographic projection of the second conductive layer on the base substrate partially overlaps with an orthographic projection of the at least one unevenness portion on the base substrate.

In another aspect, a display substrate is provided. The display substrate includes a base substrate; and a base insulating layer, a first conductive layer and an interlayer insulating layer that are sequentially stacked on top of one another at a side of the base substrate. The first conductive layer includes at least one break face, and the base insulating layer includes a portion extending outward with respect to each of the at least one break face. The break face and the corresponding portion extending outward constitute an unevenness portion having a stepped shape. The display substrate includes at least one unevenness portion, and the interlayer insulating layer covers at least the at least, one unevenness portion. The interlayer insulating layer includes: a first insulating sub-layer and a second insulating sub-layer that are sequentially stacked on top of one another. One of the first insulating sub-layer and the second insulating sub-layer is a liquid curable layer.

In some embodiments, a material of the liquid curable layer includes a flowable organic insulating material. The other of the first insulating sub-layer and the second insulating sub-layer is an inorganic insulating layer.

In some embodiments, the interlayer insulating layer further includes a third insulating sub-layer disposed on a surface of the second insulating sub-layer facing away from the base substrate. One of the first insulating sub-layer and the second insulating sub-layer, and/or the third insulating sub-layer is an inorganic insulating layer.

In some embodiments, a thickness of the first insulating sub-layer, a thickness of the second insulating sub-layer, and a thickness of the third insulating sub-layer are equal or approximately equal.

In some embodiments, the display substrate further includes a second conductive layer disposed on a surface of the interlayer insulating layer facing away from the base substrate. An orthographic projection of the second conductive layer on the base substrate partially overlaps with an orthographic projection of the at least one unevenness portion on the base substrate.

In some embodiments, the base insulating layer is a gate insulating layer, and the first conductive layer is a gate metal layer, and an orthographic projection of the gate metal layer on the base substrate is within an orthographic projection of the gate insulating layer on the base substrate. The second conductive layer is a source-drain metal layer, and an orthographic projection of the source-drain metal layer on the base substrate partially overlaps with an orthographic projection of the interlayer insulating layer on the base substrate.

In some embodiments, the gate metal layer includes a plurality of gate lines parallel or substantially parallel to each other, and the source-drain metal layer includes a plurality of data lines parallel or substantially parallel to each other. The plurality of gate lines and the plurality of data lines cross, and the plurality of gate lines and the plurality of data lines are insulated from each other. Each of the plurality of gate lines corresponds to at least one unevenness portion. An orthographic projection of the unevenness portion on the base substrate partially overlaps with orthographic projections of the plurality of data lines on the base substrate, and overlapping portions between the orthographic projection of the unevenness portion on the base substrate and the orthographic projections of the plurality of data lines on the base substrate are located beside positions where the gate line and the plurality of data lines cross.

In yet another aspect, a display device is provided. The display device includes the display substrate as provided in some embodiments described above.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on an actual size of a product and an actual process of a method that the embodiments of the present disclosure relate to.

DETAILED DESCRIPTION

Figure 1:
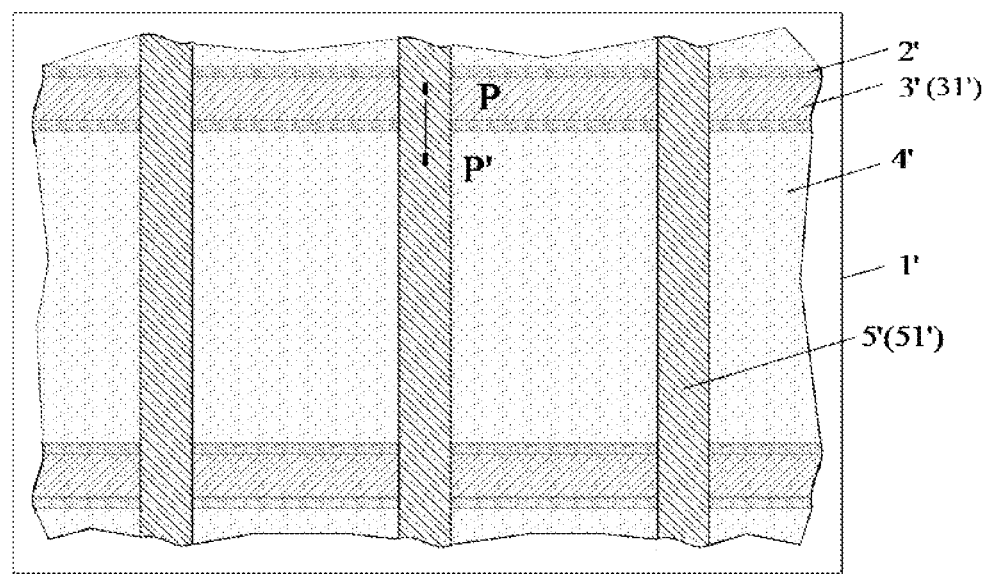
FIG. 1 is a top view of a display substrate in the related art.

Technical solutions in some embodiments of the present disclosure will be described clearly and completely with reference to accompanying drawings. Obviously, the described embodiments are merely some but not all of embodiments of the present disclosure. All other embodiments obtained by a person of ordinary skill in the art based on the embodiments provided by the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open-ended and inclusive meaning, i.e., "included, but not limited to". In the description of the specification, terms such as "one embodiment", "some embodiments", "exemplary embodiments", "example" or "some examples" are intended to indicate that specific features, structures, materials or characteristics related to the embodiment(s) or the example(s) are included in at least one embodiment or example of the present disclosure. Schematic representations of the above terms do not necessarily refer to the same embodiment or example. In addition, the specific features, structures, materials or characteristics may be included in any one or more embodiments or examples in any suitable manner.

Terms such as "first", "second" and "third" are only used for descriptive purposes, and are not to be construed as indicating or implying the relative importance or implicitly indicating the number of indicated technical features below. Thus, features defined as "first", "second" and "third" may explicitly or implicitly include one or more of the features.

The expression "at least one of A, B, or C" includes the following combinations of A, B, and C: only A, only B, only C, a combination of A and B, a combination of A and C, a combination of B and C, and a combination of A, B, and C.

Phrase "A and/or B" includes the following three combinations: only A, only B, and a combination of A and B.

For convenience of description, in the related art, in two adjacent conductive layers, a conductive layer located below is called a first conductive layer, and a conductive layer located above is called a second conductive layer. Herein, in a case where the display substrate is placed horizontally, the conductive layer located below is closer to the ground than the conductive layer located above.

In some display substrates, an insulating layer (usually called a base insulating layer) is usually provided below the first conductive layer, so as to electrically isolate the first conductive layer from other conductive structures below the first conductive layer. An area of the base insulating layer is usually slightly greater than an area of the first conductive layer. That is, a periphery of the base insulating layer has a region that is not, covered by the first conductive layer (the region is usually called a tail), so as to ensure an effect of electrical isolation. An area of an insulating layer (usually called an interlayer insulating layer) located between the first conductive layer and the second conductive layer is usually large (for example, the interlayer insulating layer is an insulating layer deposited as a whole layer), so as to cover the first conductive layer and the region of the base insulating layer that is not covered by the first conductive layer.

However, due to a limitation of the manufacturing process, an included angle between a side face of the first conductive layer and the bottom of the first conductive layer is usually an acute angle, which easily leads to a thinner thickness of the interlayer insulating layer at a position corresponding to the side face of the first conductive layer and the tail of the base insulating layer, and thus a fold is formed. In a case where the second conductive layer is subsequently formed, a tip is formed at a position of the second conductive layer corresponding to the fold. In this way, in a case where a large amount of electrical charges are accumulated in the second conductive layer, the fold in the interlayer insulating layer may be easily broken down by electrical charges accumulated at the tip. In this case, an electro-static discharge (ESD) phenomenon occurs, and there is a short circuit between the first conductive layer and the second conductive layer, and the normal transmission of electrical signals in the first conductive layer and the second conductive layer is affected.

A structure of the array substrate in the related art will be schematically described below in an example where the display substrate is an array substrate and thin film transistors in the array substrate are top-gate thin film transistors.

Figure 2:
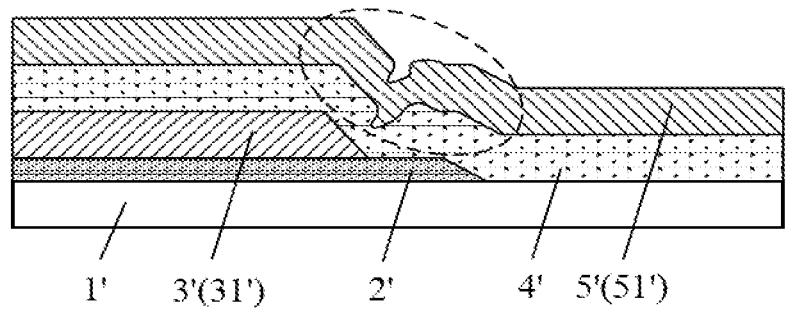
FIG. 2 is a section showing a structure of a partial region in FIG. along direction P-P'.

As shown in FIGS. 1 and 2, the array substrate usually includes a base substrate 1', and a gate insulating (GI) layer 2', a gate metal layer 3', an interlayer insulating layer 4' and a source-drain metal layer 5' that are sequentially stacked on top of one another. The gate metal layer 3' usually includes a plurality of gate lines 31', and the source-drain metal layer 5' usually includes a plurality of data lines 51'. The plurality of gate lines 31' and the plurality of data lines 51' cross.

An area of the gate metal layer 3' is slightly less than an area of the gate insulating layer 2', so that a periphery of the gate insulating layer 2' slightly protrudes from the gate metal layer 3'. A portion of the periphery of the gate insulating layer 2' slightly protruding from the gate metal layer 3' is called a tail (i.e. a GI tail).

A sectional structure along direction P-P' in FIG. 1 is shown in FIG. 2. The gate insulating layer 2' has a tail slightly protruding from the gate metal layer 3' (FIG. 1 and FIG. 2 illustrate a case where the gate metal layer 3' includes the gate lines 31') and the gate metal layer 3' has a side face corresponding to the tail. Therefore, in a case where the interlayer insulating layer 4' covers the gate metal layer 3' and the gate insulating layer portion of the interlayer insulating layer 4' corresponding the side face of the gate metal layer 3' and the tail of the gate insulating layer 2' needs to cover a continuous stepped structure of two stages formed by, the side face of the gate metal layer 3' and the tail of the gate insulating layer 2', and the portion of the interlayer insulating layer 4' is prone to form a fold. In this way, in a case where the source-drain metal layer 5' is subsequently formed (FIG. 1 and FIG. 2 illustrate a case where the source-drain metal layer 5' includes the data lines 51"), it is easy for a portion of the source-drain metal layer 5' corresponding to the continuous stepped structure of two stages to form a tip at a position of the fold (as shown by the dashed box in FIG. 2). Therefore, a data gate short (DGS) circuit phenomenon is prone to occur.

Figure 3:
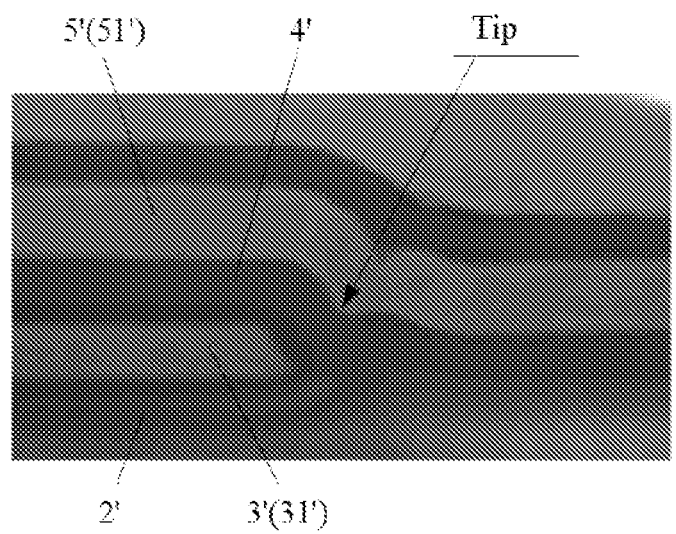
FIG. 3 is a scanning electron microscope (SEM) image of the structure shown in FIG. 2.

FIG. 3 is an SEM image of the structure shown in FIG. 2. It may be clearly shown in FIG. 3 that the portion of the source-drain metal layer 5' corresponding to the side face of the gate metal layer 3' and the tail of the base insulating layer 2' forms a tip at the position of the fold of the interlayer insulating layer 4'.

Figure 4:
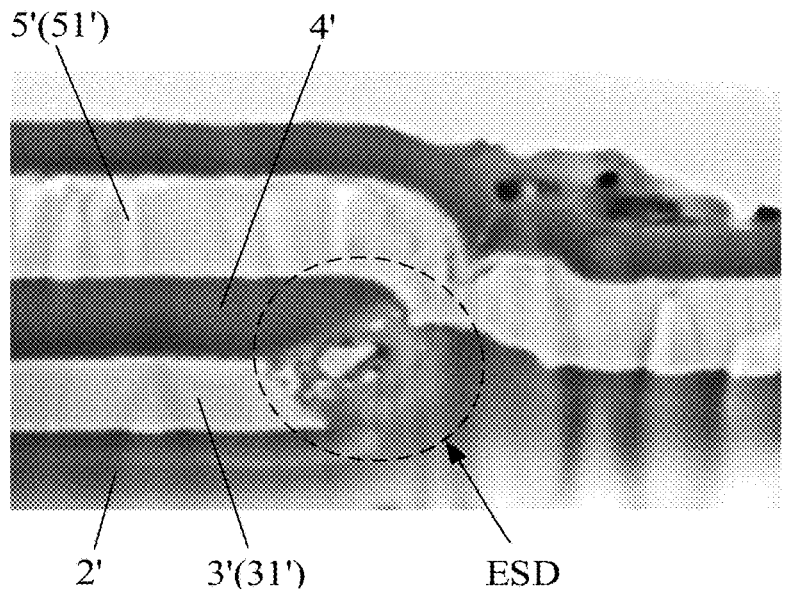
FIG. 4 is an SEM image of the structure shown in FIG. 2 with an electro-static discharge (ESD) phenomenon.

FIG. 4 is an SEM image of the structure shown in FIG. 2 with the ESD phenomenon. It may be clearly seen in FIG. 4 that electrical charges accumulated in the source-drain metal layer 5' will generate the ESD phenomenon through the tip. Therefore, the interlayer insulating layer 4' below is broken down, and there is a short circuit between the source-drain metal layer 5' and the gate metal layer 3', which eventually leads to the DGS problem.

In the related art, attempts have been made to improve the phenomenon in which the fold occurs in the portion of the interlayer insulating layer 4' corresponding to the side face of the gate metal layer 3' and the tail of the gate insulating layer 2'.

For example, an inclination of the side face of the gate metal layer 3' is reduced. However, due to a pattern of the gate metal layer 3' is usually formed through wet etching, limited by the etching method of the etching solution, the inclination of the side face of the gate metal layer 3' is difficult to be made very small. Therefore, it is difficult to effectively avoid the fold at the slope.

For another example, the tail of the gate insulating layer 2' is shortened. However, since a pattern of the gate insulating layer 2' made of an insulating material and the pattern of the gate metal layer 3' made of a metal material are formed through different etching processes, after the tail of the gate insulating layer 2' is shortened, the gate insulating layer 2' may be excessively etched (i.e., over-etched). As a result, a gate in the gate metal layer 3' is in contact with an active layer located below the gate insulating layer 2', which results in poor isolation of the gate insulating layer, and has a great impact on the electrical performance of the thin film transistor.

Therefore it is difficult for the above two attempted solutions to effectively solve the problem that the fold occurs in the interlayer insulating layer 4'.

The above description of the structure of the display substrate in the related art is based on an example where there is an ESD phenomenon between the data line 51' and the gate line 31' at the position of the fold of the interlayer insulating layer 4'. In the related art, the ESD phenomenon may occur in an insulating layer between any two adjacent conductive layers. For example, the gate metal layer 3' may further include an upper electrode of a storage capacitor provided in a same layer as the gate line 31', and the source-drain metal layer 5' may further include a lower electrode of the storage capacitor provided in a same layer as the data line 51'. A fold of an insulating layer between the upper electrode of the storage capacitor and the lower electrode of the storage capacitor may be formed at a side face of the upper electrode of the storage capacitor, and thereby the ESD phenomenon occurs. Specific structures will not be described herein again.

On this basis, some embodiments of the present disclosure provide a method of manufacturing a display substrate. As shown in FIGS. 5 to 8 (FIG. 7 and FIG. 8 are two sections along direction D-D' in FIG. 6), the method of manufacturing the display substrate includes S100 to S200.

Figure 5:
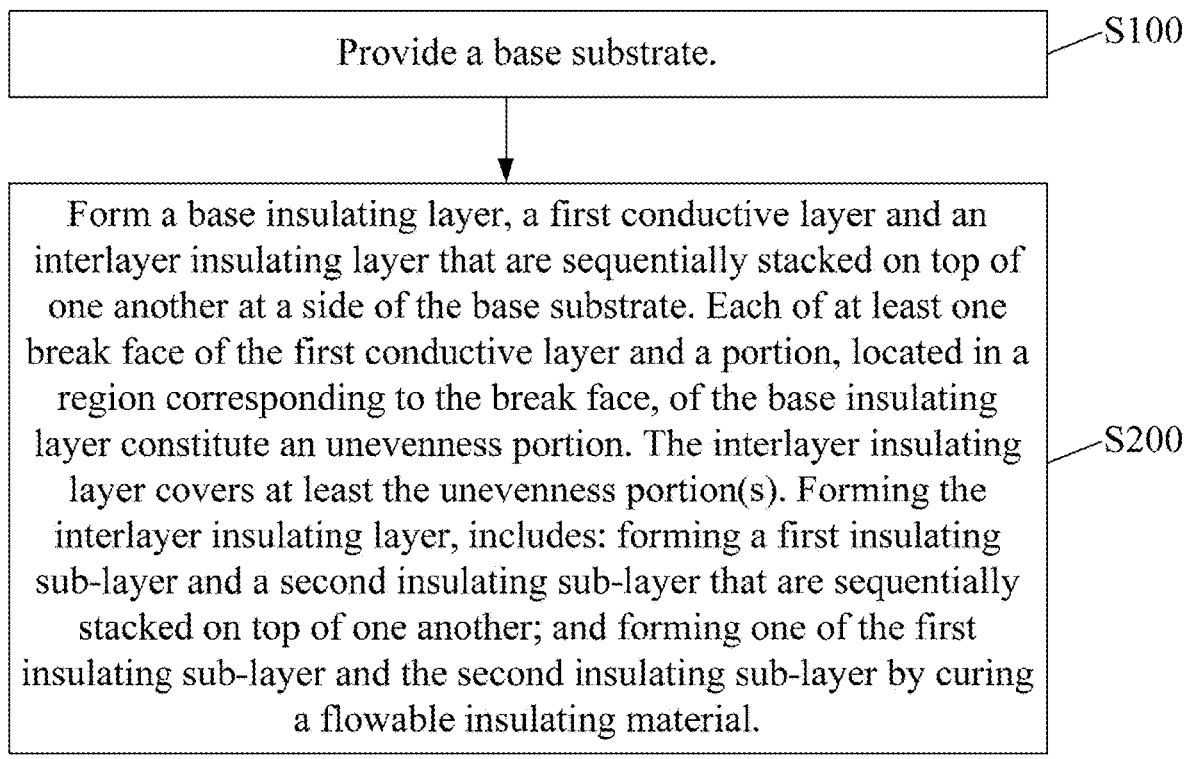
FIG. 5 is a flow chart of a method of manufacturing a display substrate, according to some embodiments of the present disclosure.

In S100, as shown in FIG. 5, part (a) in FIG. 7 and part (a) in FIG. 8, a base substrate 1 is provided.

The base substrate 1 has a variety of types, which may be selected according to actual needs, and is not limited in some embodiments of the present disclosure.

In some examples, the substrate 1 includes a rigid base substrate, such as a glass base substrate.

In some other examples, the base substrate 1 includes a flexible base substrate, such as a polyethylene glycol terephthalate (PET) base substrate a polyethylene naphthalate (PEN) base substrate or a polyimide (PI) base substrate.

Figure 6:
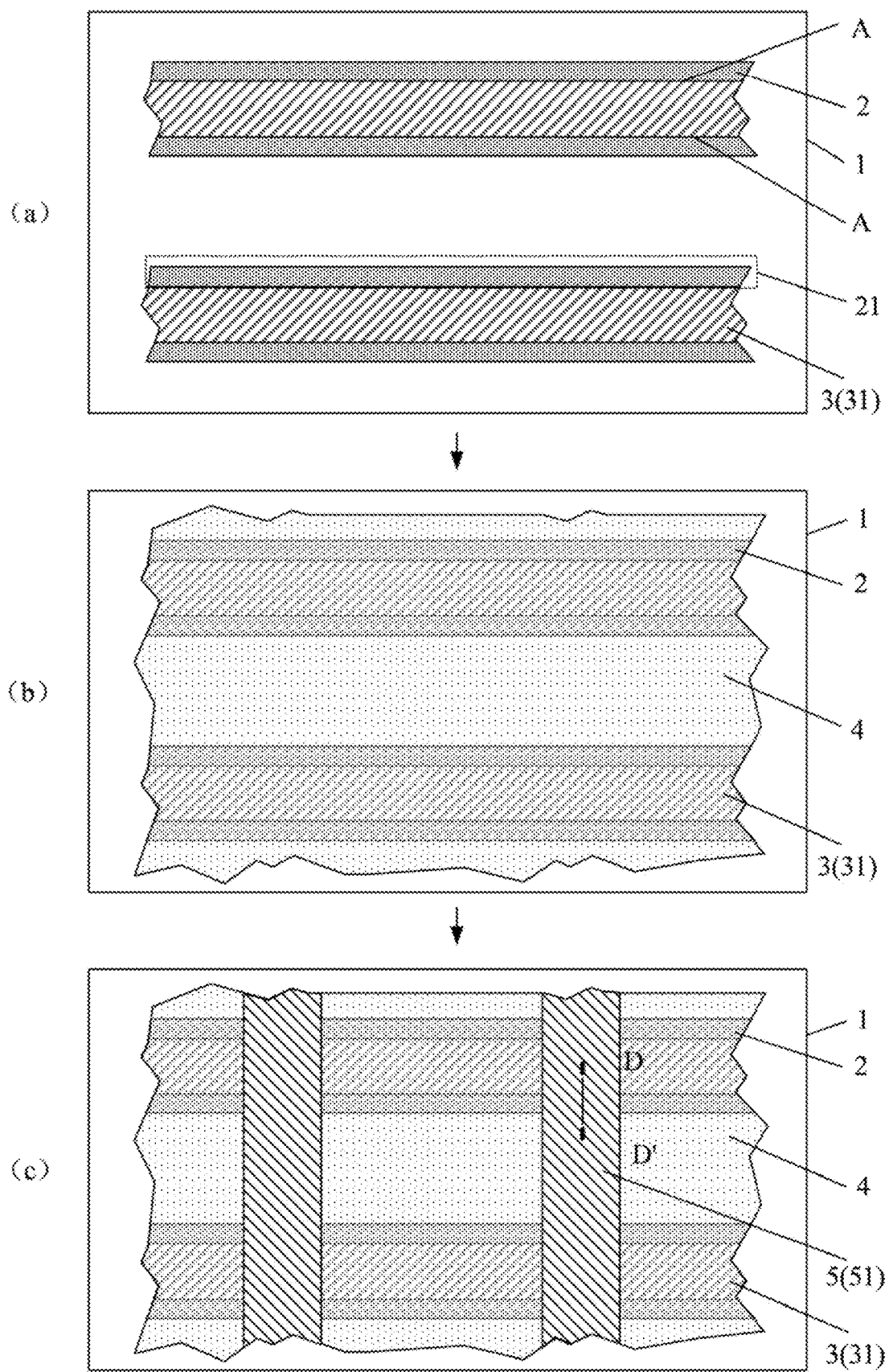
FIG. 6 is a flow chart of manufacturing a display substrate according to some embodiments of the present disclosure.
Figure 7:
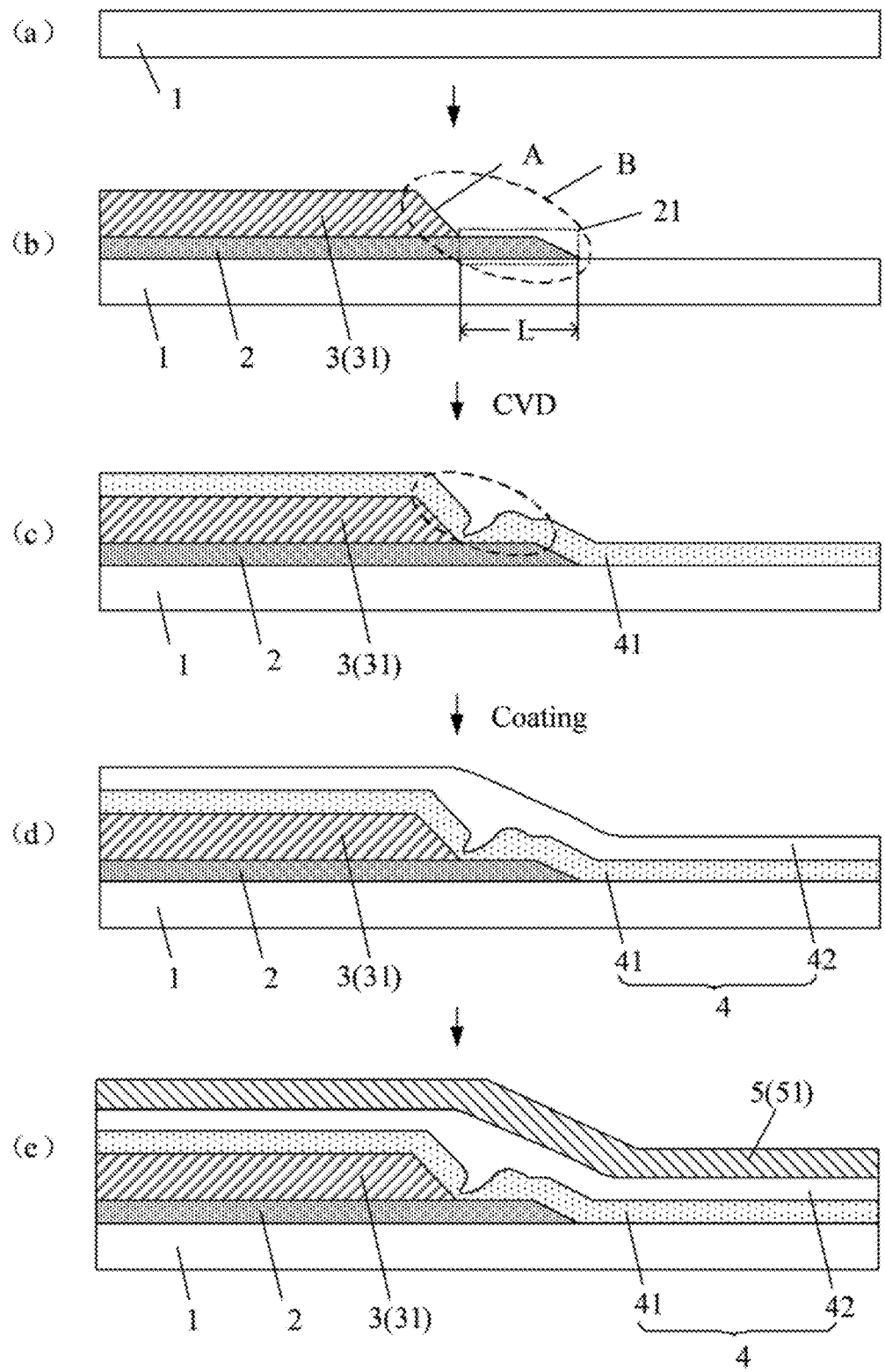
FIG. 7 is a flow chart of manufacturing a display substrate, along direction D-D' in FIG. 6.
Figure 8:
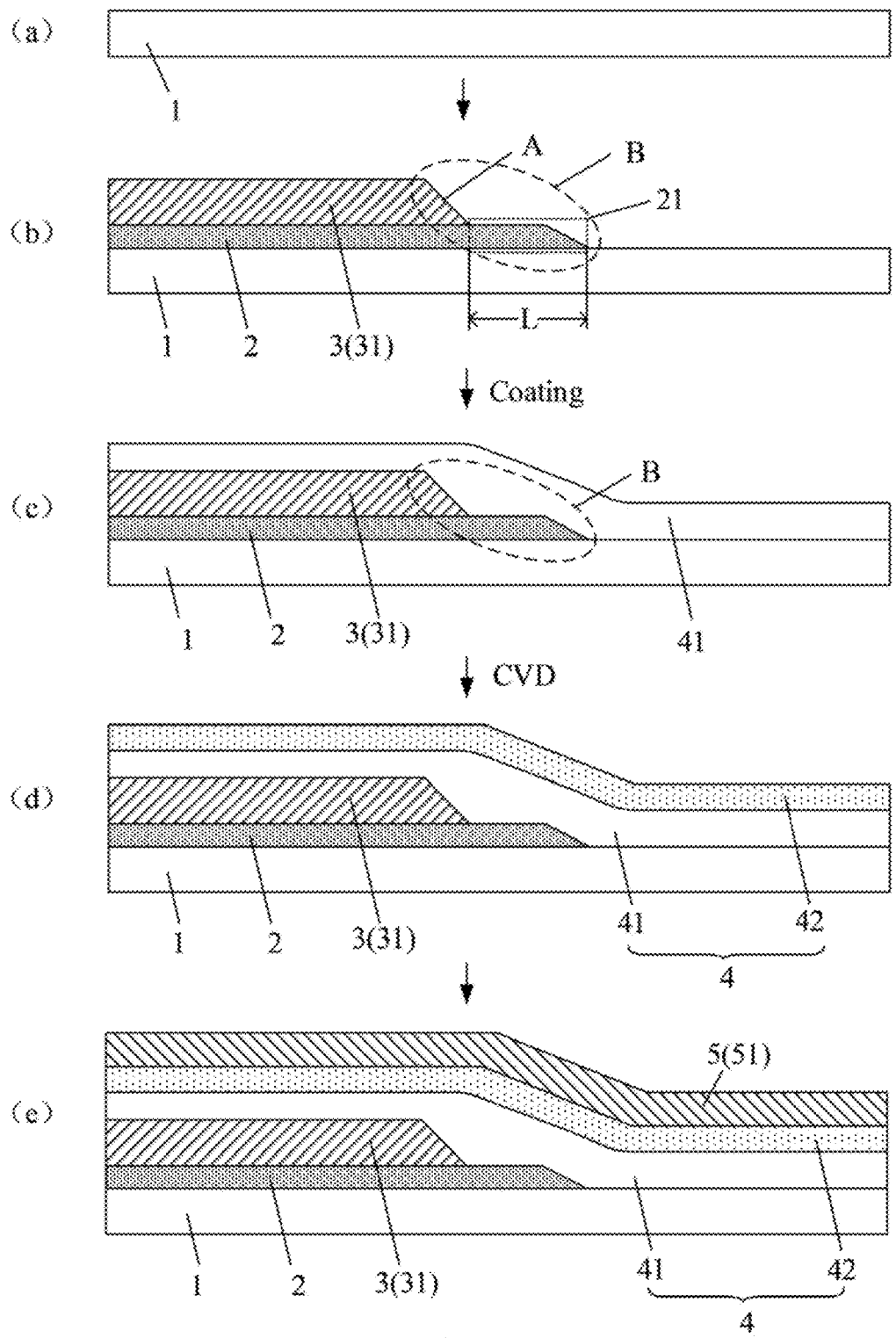
FIG. 8 is a flow chart of manufacturing another display substrate, along direction D-D' in FIG. 6.

In S200, as shown in part (a) to part (b) in FIG. 6, part (b) to part (d) in FIG. 7, and part (b) to part (d) in FIG. 8, a base insulating layer 2, a first conductive layer 3, and an interlayer insulating layer 4 are sequentially stacked on top of one another at a side of the base substrate 1. The first conductive layer 3 has at least one break face A, and the base insulating layer 2 has a portion 21 extending outward with respect to each of the at least one break face A. The break face A and the corresponding portion 21 extending outward constitute an unevenness portion B having a stepped shape. The interlayer insulating layer 4 covers at least the unevenness portion(s) B, so that the first conductive layer 3 may be better electrically isolated.

Herein, the term "break face" refers to a surface formed by the pattern disconnection in the first conductive layer 3 and an extending direction of the surface intersects with the base substrate 1. For example, the extending direction of the surface is perpendicular to the base substrate 1. Or, an included angle between the extending direction of the surface and the base substrate 1 is an acute angle.

In some examples, the pattern in the first conductive layer 3 includes a plurality of strip patterns (such as gate lines) disconnected from each other and/or a plurality of block patterns (such as gates) disconnected from each other, and opposite surfaces of two adjacent patterns are break faces.

Herein, FIG. 5 only illustrates an example in which the base insulating layer 2 is directly formed on a surface of the base substrate 1 in S200. Of course, the embodiments of the present disclosure are not limited thereto. The arrangement manner in which the base insulating layer 2 is disposed at a side of the base substrate 1 may be determined according to specific structures and design requirements of the display substrate, as long as the base insulating layer 2 and the first conductive layer 3 are sequentially stacked on top of one another at a side of the base substrate 1.

For example, at least one functional layer (i.e., a film with corresponding functions) is formed on a surface of the base substrate 1, and the base insulating layer 2 is formed on a surface of the at least one functional layer facing away from the base substrate 1. For example, the at least one functional layer includes an active layer.

For example, the display substrate is an array substrate having top-gate thin film transistors. In this case, before the base insulating layer 2 is formed, an active layer may be formed on a surface of the base substrate 1, and the base insulating layer 2 is formed on a surface of the active layer facing away from the base substrate 1. In this case, the base insulating layer 2 is a gate insulating layer, and the first conductive conductive layer 3 is a gate metal layer. The gate metal layer includes a plurality of gate lines 31.

In the embodiments of the present disclosure below, an example where the display substrate is an array substrate having top-gate thin film transistors is used to schematically describe a method of manufacturing the display substrate.

In some embodiments, in S200, the base insulating layer 2 (i.e., a gate insulating layer) and the first conductive layer 3 (i.e., a gate metal layer) being sequentially stacked on top of one another at a side of the base substrate 1, includes S210 to S250.

In S210, a base insulating film and a first metal film are sequentially formed at a side of the base substrate 1.

For example, the base insulating film may be made of silicon oxide, silicon nitride or silicon oxynitride, and may be formed through a plasma enhanced chemical vapor deposition (PECVD) process. The first metal film may be made of a metal material such as aluminum, copper, molybdenum, titanium or aluminum neodymium alloy, and may be formed through a magnetron sputtering process or an evaporation process.

In S220, a photoresist layer is formed on a surface of the first metal film facing away from the base substrate 1.

For example, the photoresist layer is formed through a coating process by using a positive photoresist. Herein, the coating process includes but is not limited to a spray coating process a spin coating process, a blade coating process, and an inkjet printing process.

In S230, the photoresist layer is exposed and developed by using a mask to form a first photoresist layer with patterns.

In S240, the first metal film is etched through a wet etching process by using the first photoresist layer with patterns as a mask to obtain the first conductive layer 3. The first conductive layer 3 includes a plurality of gate lines 31.

In S250, the base insulating film is etched through a dry etching process by using the first photoresist layer with patterns as a mask to obtain the base insulating layer 2. That is, the base insulating layer 2 and the first conductive layer 3 are formed through etching by using the same mask.

The first conductive layer 3 and the base insulating layer 2 are manufactured by using the same mask. This may not only reduce the number of used masks and reduce the cost for manufacturing the display substrate 100, but also improve alignment accuracy between the first conductive layer 3 and the base insulating layer 2. Therefore, misalignment between the base insulating layer 2 and the first conductive layer 3 may be avoided.

As shown in part (a) in FIG. 6, part (b) in FIG. 7 and part (b) in FIG. 8, since materials of the first metal film and the base insulating film are different, and the wet etching process and the dry etching process are different, an orthographic projection of the first conductive layer 3 on the base substrate 1 is within an orthographic projection of the base insulating layer 2 on the base substrate 1. It can be seen from part (a) in FIG. 6, part (b) in FIG. 7 and part (b) in FIG. 8, an area of the orthographic projection of the first conductive layer 3 on the base substrate 1 is smaller than an area of the orthographic, projection of the base insulating layer 2 on the base substrate 1. The area of the orthographic projection of the base insulating layer 2 on the base substrate 1 is smaller than an area of the surface of the base substrate 1.

In some examples, at least one break face A of the first conductive layer 3 includes a plurality of break faces A, and the plurality of break faces A include side faces of each of the plurality of gate lines 31. As shown in part (a) in FIG. 6, the side face(s) of each gate line 31 are, for example, the side face(s) of each gate line 31 opposite to side face(s) of adjacent gate line(s) 31. As shown in part (b) in FIG. 7 and part (b) in FIG. 8, the base insulating layer 2 has a portion 21 extending outward with respect to the break face A. The relationship between the structure of the first conductive layer 3 and the structure of the base insulating layer 2 makes each break face A and the corresponding portion 21 extending outward constitute an unevenness portion B having a stepped shape. That is, each side face of each gate line 31 corresponds to one unevenness portion B.

The embodiments of the present disclosure do not limit a width L (the L as marked in FIG. 7) of the portion 21 of the base insulating layer 2 extending outward with respect to the break face A. The width L may be flexibly set according to parameters such as a specific pattern of the first conductive layer 3, stability requirements for electrical performance of the thin film transistors in the formed display substrate 100, and design requirements for the thicknesses of the films in the formed display substrate 100. For example, the width L is 1 μm or slightly greater than 1 μm or slightly less than 1 μm.

The interlayer insulating layer 4 covers at least the unevenness portion(s) B, and includes multiple arrangement manners.

For example, the interlayer insulating layer 4 only covers the unevenness portion(s) B.

For example, the interlayer insulating layer 4 covers the unevenness portion(s) B and portions other than the unevenness portion(s) B. For example, the interlayer insulating layer 4 covers the unevenness portion(s) B, the first conductive layer 3 and portions of the base substrate 1 that is not covered by the base insulating layer 2.

In some embodiments, as shown in part (c) to part (d) in FIG. 7 and part (c to part (d) in FIG. 8, in S200, forming the interlayer insulating layer 4 includes: forming a first insulating sub-layer 41 and a second insulating sub-layer 42 that are sequentially stacked, and forming one of the first insulating sub-layer 41 and the second insulating sub-layer 42 by curing a flowable insulating material.

Herein, the flowable insulating material, refers to an insulating material with fluid properties. After the flowable insulating material is spread on a surface with protrusions, and depressions to forma film, the film may flow from the protrusions to the depressions. Regardless of the shapes of the depressions, a surface of the film facing away from the protrusions and depressions is substantially maintained as a relatively flat surface.

The curing means that a film is made of a flowable insulating material, and after flowing for a certain period of time, the film is converted to a solid state, and the form of the film remains in the solid state.

One of the first insulating sub-layer 41 and the second insulating sub-layer 42 is formed by curing a flowable insulating material. That is, as shown in part (d) in FIG. 7, the first insulating sub-layer 41 is made of other material, and the second insulating sub-layer 42 is formed by curing the flowable insulating material. Or, as shown in part (d) in FIG. 8, the first insulating sub-layer 41 is formed by curing the flowable insulating material, and the second insulating sub-layer 42 is made of other material.

As shown in part (c) and part (d) in FIG. 7, in a case where the second insulating sub-layer 42 is formed by curing the flowable insulating material, a fold may be generated in a portion of the first insulating sub-layer 41 corresponding to the unevenness portion B. After the second insulating sub-layer 42 is formed, the second insulating sub-layer 42 may fill or even fill up the fold, and the surface of the second insulating sub-layer 42 facing away from the base substrate 1 is substantially maintained as a relatively flat surface. That is, a surface of the entire interlayer insulating layer 4 facing away from the base substrate 1 is substantially maintained as a relatively flat surface, which prevents the entire interlayer insulating layer 4 from forming fold(s) in portion(s) corresponding to the unevenness portion(s) B.

As shown in part (c) and part (d) in FIG. 8, in a case where the firs insulating sub-layer 41 is made of the flowable insulating material, the first insulating sub-layer 41 may fill a corner position in the unevenness portion B, and the surface of the first insulating sub-layer 41 facing away from the base substrate 1 is substantially maintained as a relatively flat surface. In this way, after the second insulating sub-layer 42 is formed on the surface of the first insulating sub-layer 41 facing away from the base substrate 1 the entire second insulating sub-layer 42 may be relatively flat. Therefore, a size of the fold formed in the portion of the second insulating sub-layer 42 corresponding to the unevenness portion B may be reduced, or even the fold will not be formed; furthermore, a size of the fold formed in the portion of the interlayer insulating layer 4 corresponding to the unevenness portion B may be reduced, or even the fold will not be formed.

In this way, according to the method of manufacturing the display substrate provided by the embodiments of the disclosure, the structure of the interlayer insulating layer 4 covering at least the unevenness portion B is arranged as a structure including at least two films sequentially stacked on top of one another, and one of the at least two films is formed by curing the flowable insulating material. In this way, the surface of the entire interlayer insulating layer 4 facing away from the base substrate 1 is substantially maintained as a relatively flat surface. Therefore, the size of the fold formed in a portion of the interlayer insulating layer 4 corresponding to the unevenness portion B may be reduced, or even the fold will not be formed and morphology of the portion of the interlayer insulating layer 4 corresponding to the unevenness portion B may be effectively improved. In this way, in a case where other conductive layers are formed on the surface of the interlayer insulating layer 4 facing away from the base substrate 1, portions of other conductive layers corresponding to the unevenness portion B may be relatively flat. Therefore, it is possible to prevent tips from forming in the portions of other conductive layers corresponding to the unevenness portion B, and the ESD phenomenon between other conductive layers and the first conductive layer 3 may be prevented from occurring.

In some embodiments, in S200, forming one of the first insulating sub layer 41 and the second insulating sub-layer 42 by curing the flowable insulating material: includes S270 to S280.

In S270, an insulating film is formed through a coating process by using a flowable insulating material.

In some examples, the coating process refers to a technique for applying a fluid material to a surface of an object. The coating process includes but is not limited to a spray coating process, a spin coating process, or an inkjet printing process.

In S280, the insulating film is performed a curing treatment to form one of the first insulating sub-layer 41 and the second insulating sub-layer 42.

In some examples, the curing treatment includes a thermal curing treatment.

Herein, the temperature and time of the thermal curing treatment may be set according to actual needs, which is not limited in the present disclosure. For example, the temperature of the thermal curing treatment ranges from 200° C. to 250° C., and the time of the thermal curing treatment ranges from 10 minutes to 30 minutes. For example, the temperature of the thermal curing treatment is 200° C., and the time of the thermal curing treatment is 30 minutes. Or, the temperature of the thermal curing treatment is 220° C., and the time of the thermal curing treatment is 30 minutes. Or, the temperature of the thermal curing treatment is 230° C., and the time of thermal curing treatment is 20 minutes.

In some embodiments, the flowable insulating material used in one of the first insulating sub-layer 41 and the second insulating sub-layer 42 includes an organic insulating material. That is, one of the first insulating sub-layer 41 and the second insulating sub-layer 42 may be made of the organic insulating material through the coating process and the curing treatment; the other of the first insulating sub-layer 41 and the second insulating sub-layer 42 is made of an inorganic insulating material.

The embodiments of the present disclosure do not limit the method of manufacturing the first insulating sub-layer 41 or the second insulating sub-layer 42, which is made of the inorganic insulating material. For example, a chemical vapor deposition (CVD) process may be used to form the first insulating sub-layer 41 or the second insulating sub-layer 42.

Compared with a structure of the organic insulating material, a structure of the inorganic insulating material is denser, and the inorganic insulating material has a better isolation performance. According to some embodiments of the present disclosure, the other of the first insulating sub-layer 41 and the second insulating sub-layer 42 is made of the inorganic insulating material, which may effectively improve the isolation performance of the overall interlayer insulating layer 4. In this way, a first conductive layer 2 located on a side of the interlayer insulating layer 4 proximate to the base substrate 1 may be prevented from eroding by moisture, and stability of the structure of the first conductive layer 2 may be effectively ensured.

In some examples, since light-emitting directions of the display device to which the display substrate 100 is applied are different, the choice of the organic insulating material may be different.

For example, the light-emitting direction of the display device to which the display substrate 100 is applied is a direction from the interlayer insulating layer 4 to the base substrate 1. That is, the display device to which the display substrate 100 is applied is a bottom light-emitting display device. In this case, the flowable insulating material may be an organic insulating material that may transmit light or have a high transmittance. For example, the organic insulating material includes at least one of polyethylene terephthalate (PET), polycarbonate (PC), polymethyl methacrylate (PMMA), polyimide (PI), polyethersulfone (PES) resin, photoresist (PR), or organic silicone resin.

For example, the light-emitting direction of the display device to which the display substrate 100 is applied is a direction from the base substrate 1 to the interlayer insulating layer 4. That is, the display device to which the display substrate 100 is applied is a top light-emitting display device. In this case, the organic insulating material is an organic insulating material that may transmit light, or have a high transmittance; or an organic insulating material that does not transmit light, or has a low transmittance.

In some embodiments, in S200, forming the interlayer insulating layer 4 further includes S290.

Figure 9:
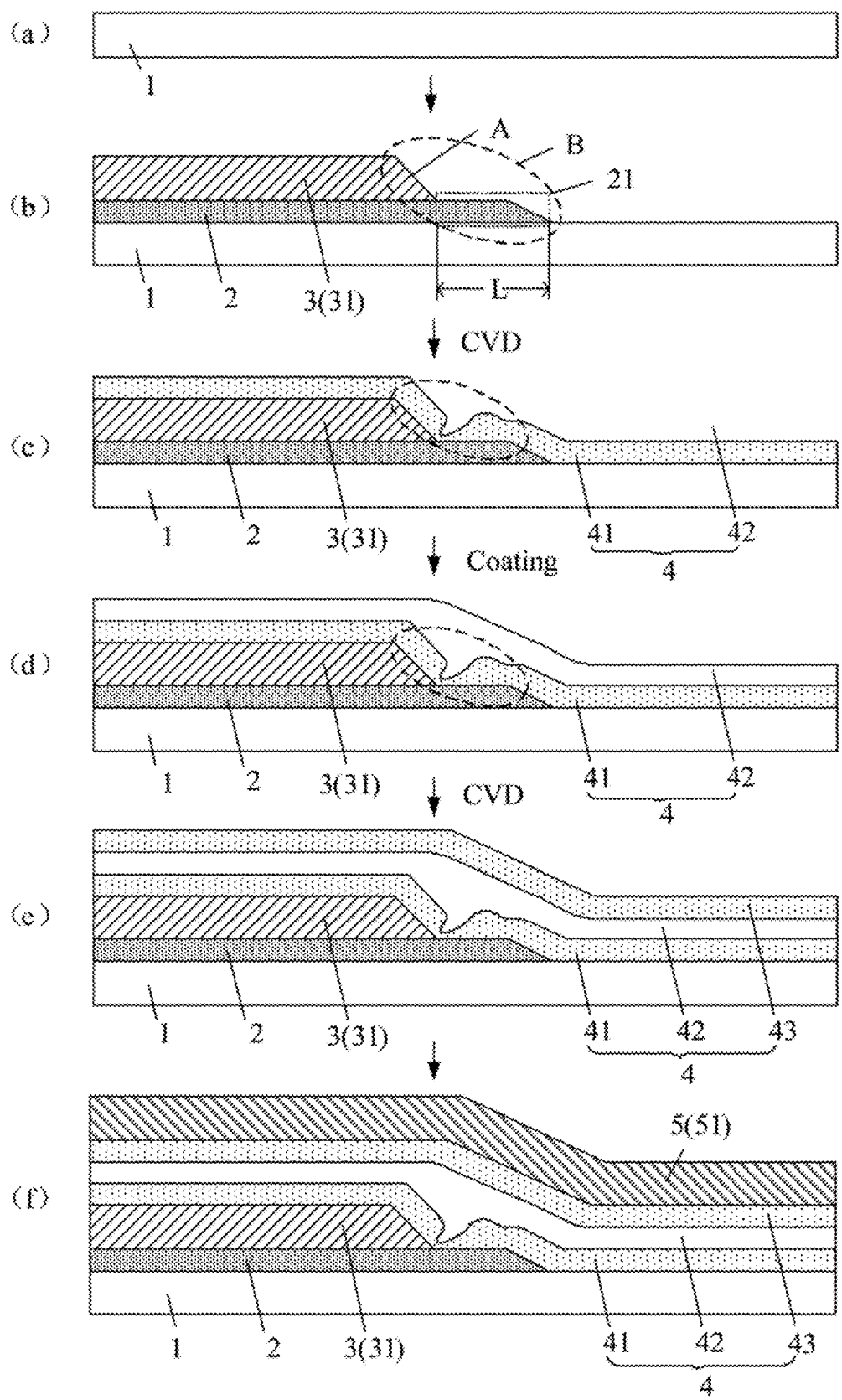
FIG. 9 is a flow chart of manufacturing yet another display substrate, along direction D-D' in FIG. 6.

In S290, as shown in part (e) in FIG. 9, a third insulating sub-layer 43 is formed on a surface of the second insulating sub-layer 42 facing away from the base substrate 1. One of the first insulating sub-layer 41 and the second insulating sub-layer 42, and/or the third insulating sub-layer 43 is made of an inorganic insulating material.

Herein, one of the first insulating sub-layer 41 and the second insulating sub-layer 42, and/or the third insulating, sub-layer 43 being made of an inorganic insulating material includes the following implementations. The first insulating sub-layer 41 is made of an inorganic insulating material; or, the second insulating sub-layer 42 is made of an inorganic insulating material; or, the third insulating sub-layer 43 is made of an inorganic insulating material; or, the first insulating sub-layer 41 and the third insulating sub-layer 43 are made of an inorganic insulating material, or, the second insulating sub-layer 42 and the third insulating sub-layer 43 are made of an inorganic insulating material. In this case, insulating sub-layer(s) in the interlayer insulating layer 4 that are not made of the inorganic insulating material are made of the organic insulating material.

In some examples, in a case where the first insulating sub-layer 41 and the third insulating sub-layer 43 are made of the inorganic insulating material, the first insulating sub-layer 41 and the third insulating sub-layer 43 are made of the same inorganic insulating material. In this way, a manufacturing process of the display substrate 100 may be simplified.

In some embodiments of the present disclosure, the manufacturing process of the interlayer insulating layer 4 will be illustrated below in an example where the interlayer insulating layer 4 has a stacked structure of "an inorganic layer+an organic layer+an inorganic layer". That is, the first insulating sub-layer 41 is made of the inorganic insulating material, the second insulating sub-layer 42 is formed by curing the organic insulating material, and the third insulating sub-layer 43 is made of the inorganic insulating material.

As shown in FIG. 9, the manufacturing process of the interlayer insulating layer 4 includes the first step to the fourth step.

In the first step, as shown in part (c) in FIG. 9, a first insulating sub-layer 41 is deposited on a surface of the first conductive layer 3 facing away from the base substrate 1 through a CVD process.

In this case, due to the presence of the unevenness portion B, and the inorganic insulating material having poor fluidity or no fluidity, there may be a fold formed in a portion of the first insulating sub-layer 41 corresponding to the unevenness portion B.

For example, the inorganic insulating material used for the first insulating sub-layer 41 is silicon oxide ($SiO_x$, the subscript X indicates that the number of oxygen atoms is not limited).

For example, a reaction source applied in the CVD process is $N_2O$ plasma and $SiH_4$ plasma. A ratio of gas flows of gases introduced in a CVD chamber is that $N_2O:SiH_4=40:1$, and a radio-frequency power (RF Power) of the plasma ranges from 2 kw to 8 kw, such as 4 kw.

In the second step, as shown in part (d) in FIG. 9, an insulating film is formed on the surface of the first insulating sub-layer 41 facing away from the base substrate 1 through a coating process.

Since the organic insulating material has a fluid property, during the formation of the insulating film the organic insulating material may flow and fill the fold in the first insulating sub-layer 41, and a surface of the finally formed insulating film facing away from the base substrate 1 is substantially maintained as a relatively flat surface.

In the third step, the insulating film is performed a thermal curing treatment to form the second insulating sub-layer 42.

After the insulating film is performed the thermal curing treatment, the insulating film can be converted into a solid state to form the second insulating sub-layer 42, and the second insulating sub-layer 42 has a stable form. In this way, it may be ensured that a relative position between the second insulating sub-layer 42 and the first insulating sub-layer 41 remains substantially unchanged, and a relative position between a film, which is subsequently formed on the surface of the second insulating sub-layer 42 facing away from the base substrate 1, and the first insulating sub-layer 41 will not change.

In the fourth step, as shown in part (e) in FIG. 9, the third insulating sub-layer 43 is deposited on a surface of the second insulating sub-layer 42 facing away from the base substrate 1 through a CVD process.

In some examples, the CVD process parameters for depositing the third insulating sub-layer 43 may be the same as the CVD process parameters for depositing the first insulating sub-layer 41, and details are not described herein again.

The structure of the interlayer insulating layer 4 is configured as the stacked structure of "an inorganic layer+an organic layer+an inorganic layer", and the second insulating sub-layer 42 may be used to improve the morphology of the portion of the interlayer insulating layer 4 corresponding to the unevenness portion B, so that the surface of the portion of the interlayer insulating layer 4 corresponding to the unevenness portion B is a relatively flat surface. Therefore, the appearance of the uneven fold may be avoided, and it is possible to prevent a second conductive layer 5 subsequently formed from forming a tip in a portion of the second conductive layer 5 corresponding to the unevenness portion B, and thereby the ESD phenomenon may be avoided.

In some embodiments, as shown in part (c) in FIG. 6, part (e) in FIG. 7, part (e) in FIG. 8, and part (f) in FIG. 9, the method of manufacturing the display substrate further includes forming a second conductive layer 5 on a surface of the interlayer insulating layer 4 facing away from the base substrate 1. An orthographic projection of the second conductive layer 5 on the base substrate 1 partially overlaps with an orthographic projection of at least one unevenness portion B on the base substrate 1.

Herein, in a case where the interlayer insulating layer 4 includes the first insulating sub-layer 41, the second insulating sub-layer 42, and the third insulating sub-layer 43, FIG. 9 merely shows that a structure of the interlayer insulating layer 4 is a stacked structure of "an inorganic layer+an organic layer+an inorganic layer". Of course, the structure of the interlayer insulating layer 4 is not limited thereto. The structure of the interlayer insulating layer 4 may refer to the description in some of the above embodiments, and details are not described herein again.

In some examples, the second conductive layer 5 is a source-drain metal layer, and the source-drain metal layer includes a plurality of data lines 51. The orthographic projection of the second conductive layer 5 on the base substrate 1 partially overlaps with the orthographic projection of the at least one unevenness portion B on the base substrate 1. That is, a plurality of data lines 51 in the second conductive layer 5 cross at least one gate line 31 corresponding to the at least one unevenness portion B. The position where the orthographic projection of the second conductive layer 5 overlaps with the orthographic projection of the at least one unevenness portion B is a position where the plurality of data lines 51 and the at least one gate line 31 cross.

The portion of the interlayer insulating layer 4 corresponding to the unevenness portion B is relatively flat and no fold is formed therein. Therefore, in the second conductive layer 5 formed on a side of the interlayer insulating layer 4 away from the base substrate 1, the portion of the second conductive layer 5 corresponding to the unevenness portion B is also relatively flat, and no tip is generated. Therefore, the problem of point discharge between the second conductive layer 5 and the first conductive layer 3 may be avoided.

In some embodiments, in a case where the display substrate is an array substrate having top-gate thin film transistors, the first conductive layer 3 (i.e., the gate metal layer) includes gates, and the second conductive layer 5 (i.e., the source-drain metal layer) includes sources and drains. The source and the drain are in electrical contact with an active layer on a side of the base insulating layer 2 proximate to the base substrate 1 through different via holes penetrating the interlayer insulating layer 4. In this way, a structure composed of the active layer, the base insulating layer 2, the gate, the interlayer insulating layer 4, the source and the drain is a top-gate thin film transistor.

Herein, there are many ways to form the via holes in the interlayer insulating layer 4.

For example, after the entire interlayer insulating layer 4 is formed, via holes penetrating the interlayer insulating layer 4 are formed in the interlayer insulating layer 4. For example, the interlayer insulating layer 4 has a structure of "an inorganic layer+an organic layer", and the insulating sub-layers in the interlayer insulating layer 4 can be penetrated at one time by laser drilling, so as to expose a surface of the active layer away from the base substrate 1.

For example, after each insulating sub-layer is formed, via holes penetrating the insulating sub-layer are formed in the insulating sub-layer. For example, the interlayer insulating layer 4 has a structure of "an inorganic layer+an organic layer+an inorganic layer". In this case, the second insulating sub-layer 42 is made of photoresist. The way for forming the via holes is as follows. After the first insulating sub-layer 41 is deposited, inorganic layer via holes exposing the active layer are formed in the first insulating sub-layer 41 through dry etching. After the photoresist is coated and cured to form the second insulating sub-layer 42, the second insulating sub-layer 42 is exposed and developed by using a same mask to form photoresist layer via holes at positions corresponding to the inorganic layer via holes to expose the active layer. After the third insulating sub-layer 43 is deposited, inorganic layer via holes are formed at positions of the third insulating sub-layer 43 corresponding to the photoresist layer via holes by using dry etching through a same mask to expose the active layer.

Some embodiments of the present disclosure provide a display substrate 100. As shown in FIGS. 10 to 13, the display substrate 100 includes a base substrate 1, and a base insulating layer 2, a first conductive layer 3, and an interlayer insulating layer 4 that are sequentially stacked on top of one another at a side of the base substrate 1. The first conductive layer 3 has at least one break face A, and the base insulating layer 2 has a portion 21 extending outward with respect to each of the at least one break face A. Each break face A and the corresponding portion 21 extending outward constitute a unevenness portion B of a stepped shape, and the interlayer insulating layer 4 covers at least the unevenness portion(s) B. The interlayer insulating layer 4 includes: a first insulating sub-layer 41 and a second insulating sub-layer 42 that are sequentially stacked on top of one another. One of the first insulating sub-layer 41 and the second insulating sub-layer 42 is a liquid curable layer.

Figure 11:
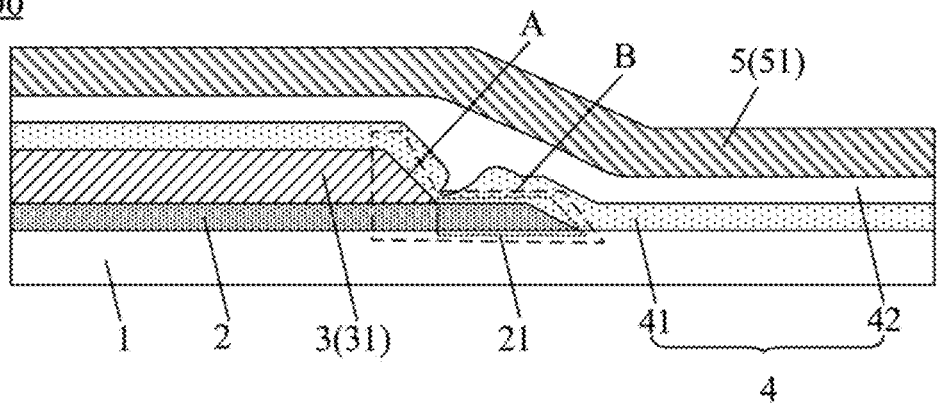
FIG. 11 is a structural diagram of a display substrate, along direction E-E' in FIG. 10.
Figure 12:
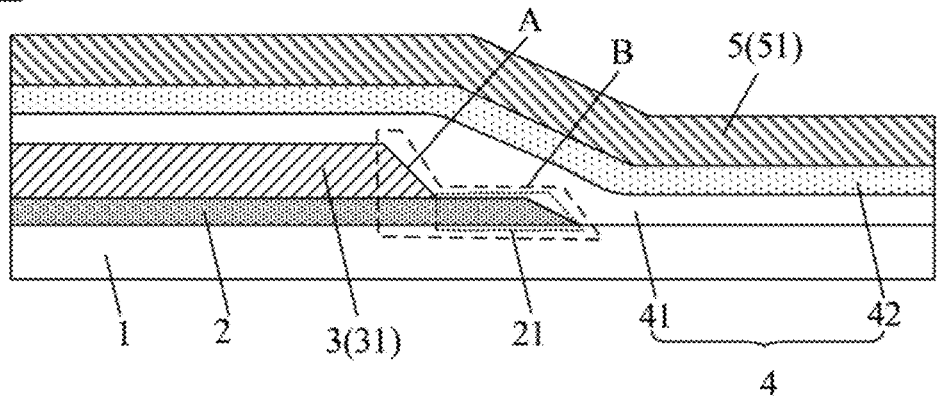
FIG. 12 is a structural diagram of another display substrate, along direction E-E' in FIG. 10.

For example, the liquid curable layer refers to a film formed by curing a flowable insulating material (i.e., an insulating material with fluid properties), and a surface of the film facing away from the base substrate 1 is a relatively flat surface. In this way, as shown in FIG. 12, the first insulating sub-layer 41 is a liquid curable layer, and the topography of the second insulating sub-layer 42 is relatively flat, thereby ensuring that the topography of the interlayer insulating layer 4 is relatively flat. As shown in FIG. 11, the second insulating sub-layer 42 is a liquid curable layer, and the second insulating sub-layer 42 may be used to fill the fold that may occur in the first insulating sub-layer 41, so that a surface of the second insulating sub-layer 42 facing away from the base substrate 1 is a relatively flat surface, thereby ensuring that the topography of the interlayer insulating layer 4 is relatively flat.

Herein, the term "break face" refers to a surface formed by the pattern disconnection in the first conductive layer 3, and an extending direction of the surface intersects with the base substrate 1. For example, the extending direction of the surface is perpendicular to the base substrate 1. Or, an included angle between the extending direction of the surface and the base substrate 1 is an acute angle. In some examples, the pattern in the first conductive layer 3 includes a plurality of strip patterns (such as gate lines) disconnected from each other and/or a plurality of block patterns (such as gates) disconnected from each other, and opposite surfaces of two adjacent patterns are break faces.

In some embodiments, as shown in FIGS. 10 to 13, the display substrate 100 further includes: a second conductive layer 5 disposed on a surface of the interlayer insulating layer 4 facing away from the base substrate 1. An orthographic projection of the second conductive layer 5 on the base substrate 1 partially overlaps with an orthographic projection of at least one unevenness portion B on the base substrate 1.

In some examples, the base insulating layer 2 is a gate insulating layer, and the first conductive layer 3 is a gate metal layer. An orthographic projection of the gate insulating layer (i.e., the base insulating layer 2) on the base substrate 1 is within the boundary of the base substrate 1, and an orthographic projection of the gate metal layer (i.e. the first conductive layer 3) on the base substrate 1 is within the orthographic projection of the gate insulating layer (i.e., the base insulating layer 2) on the base substrate 1. That is, a periphery of the gate insulating layer (i.e., the base insulating layer 2) extends outward with respect to the gate metal layer (i.e., the first conductive layer 3).

Figure 10:
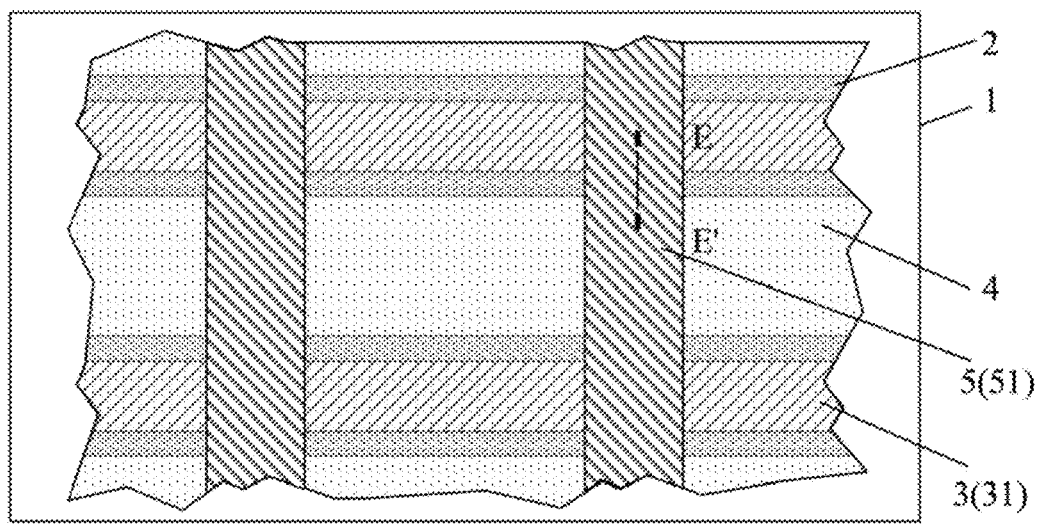
FIG. 10 is a top view of a display substrate, according to some embodiments of the present disclosure.

As shown in FIG. 10, the gate metal layer (i.e., the first conductive layer 3) includes a plurality of gate lines 31 parallel or substantially parallel to each other. At least one break face A of the first conductive layer 3 includes a side face of each gate line 31 of the plurality of gate lines 31 and a side face of an adjacent gate line 31 opposite thereto. The unevenness portion B is composed of the side face of each gate line 31 and the portion of the base insulating layer 2 extending outward with respect to the side face of the gate line 31. Each side face corresponds to one unevenness portion B. Each gate line 31 includes at least one side face. That is, each gate line 31 corresponds to at least one unevenness portion B.

The interlayer insulating layer 4 covers at least the unevenness portion(s) B. That is, the interlayer insulating layer 4 only covers the unevenness portion(s) B. Or, the interlayer insulating layer 4 covers the unevenness portion(s) B and portions other than the unevenness portion(s) B. For example, as shown in FIG. 10, the interlayer insulating layer 4 covers the unevenness portions B, and covers the first conductive layer 3 and portions of the base substrate 1 that is not covered by the base insulating layer 2.

In some examples, the second conductive layer 5 is a source-drain metal layer, and an orthographic projection of the source-drain metal layer on the base substrate 1 partially overlaps with an orthographic projection of the interlayer insulating layer 4 on the base substrate 1. As shown in FIG. 10, the source-drain metal layer (i.e., the second conductive layer 5) includes a plurality of data lines 51 parallel or substantially parallel to each other. The plurality of gate lines 31 in the first conductive layer 3 and the plurality of data lines 51 cross, and they are insulated from each other.

Since the interlayer insulating layer 4 covers at least the unevenness portion(s) B, the orthographic projection of the source-drain metal layer on the base substrate 1 partially overlaps with the orthographic projection of the unevenness portion B on the base substrate 1. Since the source-drain metal layer includes a plurality of data lines 51 the orthographic projection of the unevenness portion B on the base substrate 1 partially overlaps with orthographic projections of the plurality of data lines 51 on the base substrate 1, and the overlapping portions between the orthographic projection of the unevenness portion B on the base substrate 1 and the orthographic projections of the plurality of data lines 51 on the base substrate 1 are located beside the positions where each gate line and the plurality of data lines 51 cross.

In the display substrate 100 provided by some embodiments of the present disclosure, by arranging one of the first insulating sub-layer 41 and the second insulating sub-layer 42 as a liquid curable layer, it may be ensured that a surface of one of the first insulating sub-layer 41 and the second insulating sub-layer 42 facing away from the base substrate 1 is a flat surface, and ensured that the morphology of the interlayer insulating layer 4 is relatively flat. Therefore, it is possible to prevent the portion of the interlayer insulating layer 4 corresponding to the unevenness portion B from forming a fold, to prevent the portion of the second conductive layer 5 corresponding to the unevenness portion B from forming a tip, and the ESD phenomenon between the second conductive layer 5 and the first conductive layer 3 may be avoided.

In some embodiments, a material of the liquid curable layer includes a flowable organic insulating material. That is, one of the first insulating sub-layer 41 and the second insulating sub-layer 42 is made of the flowable organic insulating material. The other of the first insulating sub-layer 41 and the second insulating sub-layer 42 is an inorganic insulating layer. In this way, the liquid curable layer is used to improve the overall morphology of the interlayer insulating layer 4, and the portion of the interlayer insulating layer 4 corresponding to the unevenness portion B is prevented from forming the fold; meanwhile, the inorganic insulating layer is used to block moisture, and the first conductive layer 3 is prevented from being eroded by the moisture.

Figure 13:
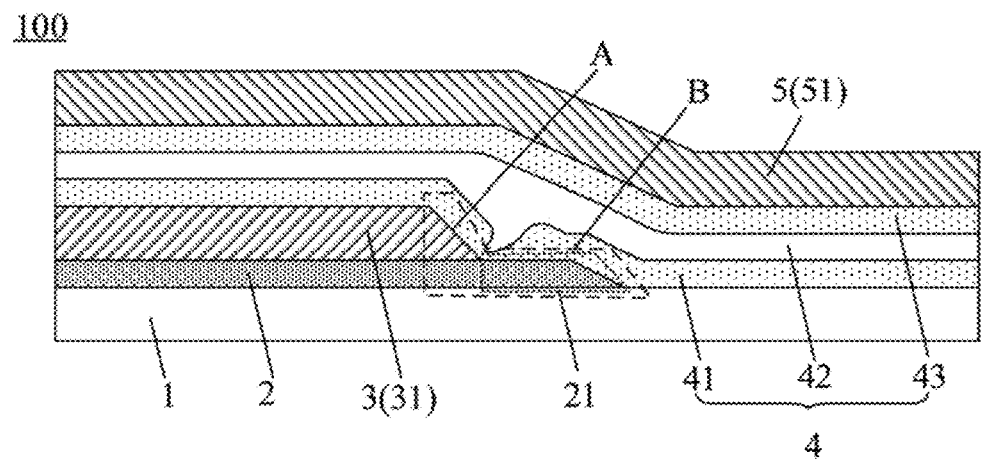
FIG. 13 is a structural diagram of another display substrate, along direction E-E' in FIG. 10.

In some embodiments, as shown in FIG. 13, the interlayer insulating layer 4 further includes a third insulating sub-layer 43 disposed on a surface of the second insulating sub-layer 42 facing away from the base substrate 1. One of the first insulating sub-layer 41 and the second insulating sub-layer 42, and/or the third insulating sub-layer 43 is an inorganic insulating layer.

Herein, one of the first insulating sub-layer 41 and the second insulating sub-layer 42, and/or the third insulating sub-layer 43 is an inorganic insulating layer, which includes the following implementations. The first insulating sub-layer 41 is an inorganic insulating layer; or the second insulating sub-layer 42 is an inorganic insulating layer; or the third insulating sub-layer 43 is an inorganic insulating layer; or, as shown in FIG. 13, the first insulating sub-layer 41 and the third insulating sub-layer 43 are inorganic insulating layers; or the second insulating sub-layer 42 and the third insulating sub-layer 43 are inorganic insulating layers.

One of the first insulating sub-layer 41 and the second insulating sub-layer 42, and/or the third insulating sub-layer 43 is arranged as an inorganic insulating layer. In this way, on one hand, the liquid cured layer may be used to improve the overall morphology of the interlayer insulating layer, and the portion of the interlayer insulating layer 4 corresponding to the unevenness portion B may be prevented from forming the fold, thereby preventing the ESD phenomenon from occurring between the two conductive layers. On another hand, a good contact performance and a good adhesion between the interlayer insulating layer 4 and the first conductive layer 3, and/or between the interlayer insulating layer 4 and the second conductive layer 5 may be ensured by using the inorganic insulating layer.

Herein, a thickness of the interlayer insulating layer 4, and a thickness of the first insulating sub-layer 41 a thickness of the second insulating sub-layer 42 and a thickness of the third insulating sub-layer 43 may be set according to actual needs, which is not limited in some embodiments of the present disclosure. For example, the thickness of the interlayer insulating layer 4 ranges from 5000 Å to 7000 Å, and the thickness of the first insulating sub-layer 41, the thickness of the second insulating sub-layer 42, and the thickness of the third insulating sub-layer 43 range from 1000 Å to 3000 Å.

In some embodiments, the thickness of the first insulating sub-layer 41, the thickness of the second insulating sub-layer 42, and the thickness of the third insulating sub-layer 43 are equal or approximately equal. For example, the thickness of the interlayer insulating layer 4 is 6000 Å: the thickness of the first insulating sub-layer 41, the thickness of the second insulating sub-layer 42, and the thickness of the third insulating sub-layer 43 are all one third of the thickness of the interlayer insulating layer 4, i.e., 2000 Å.

Herein, the "thickness" is a dimension of a film in a direction perpendicular to the base substrate 1, and the dimension may be a largest dimension or a smallest dimension, or an average dimension. The film includes the interlayer insulating layer 4, the first insulating sub-layer 41, the second insulating sub-layer 42, and the third insulating sub-layer 43.

In some embodiments, the display substrate 100 further includes an active layer disposed on a side of the base insulating layer 2 proximate to the base substrate 1. The gate metal layer (i.e., the first conductive layer 3) further includes a gate, and a source-drain metal layer (i.e., the second conductive layer 5) further includes a source and a drain. The source and the drain are in electrical contact with the active layer through different via holes penetrating the interlayer insulating layer 4 and the base insulating layer 2. In this case, the active layer, the gate, the source, and the drain in the structure constitute a top-gate thin film transistor. The display substrate 100 further includes a pixel electrode, a common electrode, an anode, a light-emitting layer or a cathode disposed at a side of the source-drain metal layer away from the base, substrate which may be selected according to actual needs, and details will not be described in some embodiments of the present disclosure.

Figure 14:
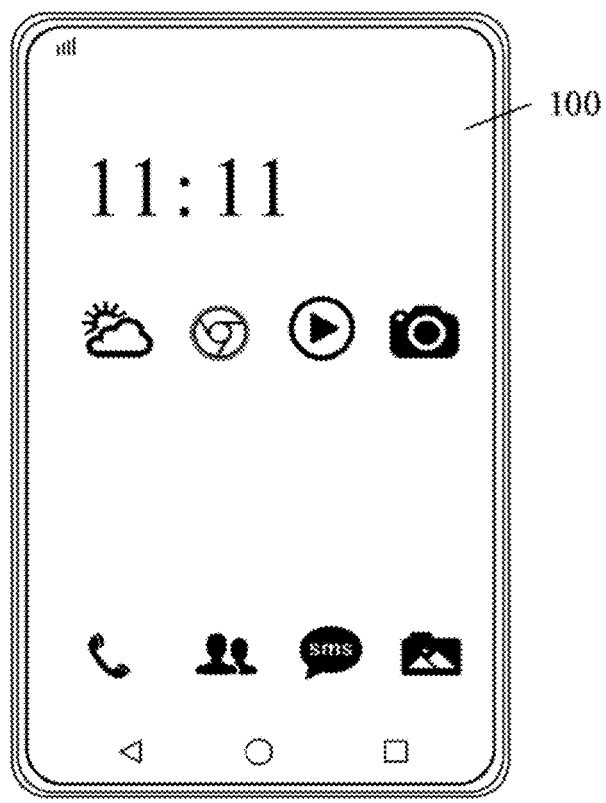
FIG. 14 is a structural diagram of a display device, according to some embodiments of the present disclosure.

Some embodiments of the present disclosure provide a display device 200. As shown in FIG. 14 the display device 200 includes the display substrate 100 as provided in some embodiments described above. The display substrate 100 in the display device 200 has the same technical effects as the display substrate 100 in some embodiments described above, which will not be repeated herein.

The display device 200 includes various types.

For example, the display device 200 is a liquid crystal display (LCD) device. In a case where the display substrate 100 is an array substrate, the display device 200 further includes a color filter substrate disposed opposite to the array substrate, and a liquid crystal layer located between the color film substrate and the array substrate. In a case where the display substrate 100 is a color filter on array (COA) substrate (that is, a color filter layer is formed on the array substrate), the display device 200 further includes a cover plate disposed opposite to the COA substrate, and a liquid crystal layer located between the cover plate and the COA substrate.

For example, the display device 200 is an organic light-emitting diode (OLED) display device. In this case, the display substrate 100 includes an array substrate in which an OLED light-emitting device layer is disposed in the array substrate, and the OLED light-emitting device layer includes a plurality of OLED light-emitting devices.

According to different colors of light emitted by the OLED, light-emitting device layer, the display device may further include structures for realizing other functions. For example, the light emitted by the OLED light-emitting device layer has multiple colors (such as red, green, and blue), and the display device 200 may further include a cover plate. For another example, the color of the light emitted by the OLED device layer is white, and the display device 200 may further include a color filter substrate or a color filter layer.

The display device 200 provided by the embodiments of the present disclosure may be any device that displays images whether moving (e.g., videos) or stationary (e.g., still images), and whether literal or graphical. It is anticipated that the described embodiments may be implemented in or associated with a variety of electronic devices, and the variety of the electronic devices may include but not limit to mobile telephones, wireless devices, personal digital assistants, hand-held or portable computers, global positioning system (GPS) receivers, GPS navigators, cameras, MPEG-4 Part 14 (MP4) video player, video cameras, game consoles, watches, clocks, calculators, TV monitors, flat panel displays, computer monitors, car displays (e.g., an odometer display), navigators, cockpit controllers and/or displays, displays for camera view (e.g., a display for a rear view camera in a vehicle), electronic photos, electronic billboards or signboards, projectors, building structures, packaging and aesthetic structures (e.g., a display for an image of a piece of jewelry), etc.

The foregoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A method of manufacturing a display substrate, comprising:

providing a base substrate; and forming a base insulating layer, a first conductive layer and an interlayer insulating layer that are sequentially stacked on top of one another at a side of the base substrate; wherein the first conductive layer includes at least one break face, the base insulating layer includes a portion extending outward with respect to each break face of the at least one break face, and the break face and the corresponding portion extending outward constitute an unevenness portion having a stepped shape;

the display substrate includes at least one unevenness portion, and the interlayer insulating layer covers at least the at least one unevenness portion; and forming the interlayer insulating layer, includes: forming a first insulating sub-layer and a second insulating sub-layer that are sequentially stacked on top of one another; and forming the first insulating sub-layer by curing a flowable insulating material;

the flowable insulating material includes an organic insulating material; and the second insulating sub-layer is made of an inorganic insulating material; and the first insulating sub-layer further covers the first conductive layer, and a thickness of a portion of the first insulating sub-layer covering the at least one unevenness portion is greater than a thickness of a portion of the first insulating sub-layer covering the first conductive layer.

2. The method of manufacturing the display substrate according to claim 1, wherein the organic insulating material includes at least one of polyethylene terephthalate, polycarbonate, polymethyl methacrylate, polyimide, polyethersulfone resin, photoresist, or organic silicone resin.

3. The method of manufacturing the display substrate according to claim 1, wherein
forming the first insulating sub-layer by curing the flowable insulating material, includes:
forming an insulating film through a coating process by using the flowable insulating material; and
performing a curing treatment on the insulating film to form the first insulating sub-layer.

4. The method of manufacturing the display substrate according to claim 3, wherein the curing treatment includes a thermal curing treatment;
a temperature of the thermal curing treatment ranges from 200° C. to 250° C., and time of the thermal curing treatment ranges from 10 minutes to 30 minutes.

5. The method of manufacturing the display substrate according to claim 1, wherein
forming the interlayer insulating layer, further includes:
forming a third insulating sub-layer on a surface of the second insulating sub-layer facing away from the base substrate;
the third insulating sub-layer is made of the inorganic insulating material.

6. The method of manufacturing the display substrate according to claim 1, further comprising: forming a second conductive layer on a surface of the interlayer insulating layer facing away from the base substrate; wherein
an orthographic projection of the second conductive layer on the base substrate partially overlaps with an orthographic projection of the at least one unevenness portion on the base substrate.

7. A display substrate, comprising:
a base substrate; and
a base insulating layer, a first conductive layer and an interlayer insulating layer that are sequentially stacked on top of one another at a side of the base substrate; wherein
the first conductive layer includes at least one break face, the base insulating layer includes a portion extending outward with respect to each break face of the at least one break face, and the break face and the corresponding portion extending outward constitute an unevenness portion having a stepped shape;
the display substrate includes at least one unevenness portion, and the interlayer insulating layer covers at least the at least one unevenness portion;
the interlayer insulating layer includes: a first insulating sub-layer and a second insulating sub-layer that are sequentially stacked on top of one another; and the first insulating sub-layer is a liquid curable layer;
a material of the liquid curable layer includes a flowable organic insulating material; and the second insulating sub-layer is an inorganic insulating layer; and
the first insulating sub-layer further covers the first conductive layer, and a thickness of a portion of the first insulating sub-layer covering the at least one unevenness portion is greater than a thickness of a portion of the first insulating sub-layer covering the first conductive layer.

8. The display substrate according to claim 7, wherein the interlayer insulating layer further includes a third insulating sub-layer disposed on a surface of the second insulating sub-layer facing away from the base substrate; wherein
the third insulating sub-layer is an inorganic insulating layer.

9. The display substrate according to claim 8, wherein a thickness of a portion of the first insulating sub-layer covering the first conductive layer, a thickness of the second insulating sub-layer, and a thickness of the third insulating sub-layer are approximately equal.

10. The display substrate according to claim 7, further comprising a second conductive layer disposed on a surface of the interlayer insulating layer facing away from the base substrate; wherein
an orthographic projection of the second conductive layer on the base substrate partially overlaps with an orthographic projection of the at least one unevenness portion on the base substrate.

11. The display substrate according to claim 10, wherein the base insulating layer is a gate insulating layer, and the first conductive layer is a gate metal layer, and an orthographic projection of the gate metal layer on the base substrate is within an orthographic projection of the gate insulating layer on the base substrate; and
the second conductive layer is a source-drain metal layer, and an orthographic projection of the source-drain metal layer on the base substrate partially overlaps with an orthographic projection of the interlayer insulating layer on the base substrate.

12. The display substrate according to claim 11, wherein the gate metal layer includes a plurality of gate lines parallel or substantially parallel to each other, and the source-drain metal layer includes a plurality of data lines parallel or substantially parallel to each other;
the plurality of gate lines and the plurality of data lines cross, and the plurality of gate lines and the plurality of data lines are insulated from each other;
each gate line of the plurality of gate lines corresponds to at least one unevenness portion;
an orthographic projection of the unevenness portion on the base substrate partially overlaps with orthographic projections of the plurality of data lines on the base substrate, and overlapping portions between the orthographic projection of the unevenness portion on the base substrate and the orthographic projections of the plurality of data lines on the base substrate are located beside positions where the gate line and the plurality of data lines cross.

13. A display device, comprising the display substrate according to claim 7.

* * * * *